US011073710B2

(12) United States Patent
Kim et al.

(10) Patent No.: US 11,073,710 B2
(45) Date of Patent: Jul. 27, 2021

(54) DISPLAY APPARATUS

(71) Applicant: SAMSUNG ELECTRONICS CO., LTD., Suwon-si (KR)

(72) Inventors: Kyoung Hwan Kim, Suwon-si (KR); Do Wan Kim, Suwon-si (KR); Myeong Gil Kim, Suwon-si (KR); Min Chul Kim, Suwon-si (KR); Boum Sik Kim, Suwon-si (KR); Tae Youn Yoon, Suwon-si (KR); Sang Min Lee, Suwon-si (KR); Hyun Jun Jung, Suwon-si (KR); Hye Ryung Hwang, Suwon-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 0 days.

(21) Appl. No.: 16/401,764

(22) Filed: May 2, 2019

(65) Prior Publication Data
US 2019/0339559 A1 Nov. 7, 2019

(30) Foreign Application Priority Data

May 2, 2018 (KR) .................. 10-2018-0050737

(51) Int. Cl.
G02F 1/1333 (2006.01)
(52) U.S. Cl.
CPC .... G02F 1/133308 (2013.01); G02F 1/13332 (2021.01); G02F 1/133334 (2021.01)
(58) Field of Classification Search
None
See application file for complete search history.

(56) References Cited

U.S. PATENT DOCUMENTS

2004/0124748 A1* 7/2004 Takeshima ............. H04R 17/00
310/331
2004/0228580 A1* 11/2004 Lee ...................... G02B 6/4239
385/49
2007/0070263 A1 3/2007 Nishimura et al.
(Continued)

FOREIGN PATENT DOCUMENTS

JP 2008-185934 8/2008
JP 5951464 6/2016
(Continued)

OTHER PUBLICATIONS

International Search Report and Written Opinion of the International Searching Authority dated Aug. 8, 2019 in International Patent Application No. PCT/KR2019/005282.
(Continued)

Primary Examiner — Ryan Crockett
(74) Attorney, Agent, or Firm — Staas & Halsey LLP

(57) ABSTRACT

Provided is a display apparatus including a bezel that is improved to prevent electrostatic discharge (ESD). The display apparatus includes a display panel on which an image is to be displayed, a chassis arranged at a rear side of the display panel and including a conductive material, a bezel configured to support the display panel and including a non-conductive material, and an adhesive including a conductive material and coated on an inner side surface of the bezel such that static electricity is guided away from being discharged toward an inside of the display apparatus.

10 Claims, 9 Drawing Sheets

(56) References Cited

U.S. PATENT DOCUMENTS

| | | | |
|---|---|---|---|
| 2008/0123016 A1* | 5/2008 | Kwak | G02F 1/133308 |
| | | | 349/59 |
| 2009/0033825 A1* | 2/2009 | Fukayama | G02F 1/133308 |
| | | | 349/58 |
| 2010/0075189 A1* | 3/2010 | Cha | H01M 8/0206 |
| | | | 429/483 |
| 2012/0162880 A1* | 6/2012 | Yoon | G02F 1/1339 |
| | | | 361/679.01 |
| 2012/0327328 A1* | 12/2012 | Kim | G02F 1/133308 |
| | | | 349/59 |
| 2015/0323843 A1* | 11/2015 | Park | G02F 1/133308 |
| | | | 362/607 |
| 2018/0031929 A1 | 2/2018 | Huang et al. | |
| 2018/0203553 A1* | 7/2018 | Li | H05K 1/147 |

FOREIGN PATENT DOCUMENTS

| | | | |
|---|---|---|---|
| KR | 10-0421737 | | 10/2001 |
| KR | 10-2007-0035667 | | 4/2007 |
| KR | 10-2008-0035784 | * | 4/2008 |
| KR | 10-2009-0129559 | | 12/2009 |
| KR | 10-2013-0001068 | | 1/2013 |
| KR | 10-2017-0062140 | | 6/2017 |

OTHER PUBLICATIONS

Extended European Search Report dated Apr. 13, 2021 in European Patent Application No. 19795993.5.

* cited by examiner

DISPLAY APPARATUS

CROSS-REFERENCE TO RELATED APPLICATION

This application is based on and claims priority under 35 U.S.C. § 119 to Korean Patent Application No. 10-2018-0050737, filed on May 2, 2018 in the Korean Intellectual Property Office, the disclosure of which is incorporated herein by reference.

BACKGROUND

1. Field

The disclosure relates to a display apparatus including an improved bezel to prevent electrostatic discharge (ESD).

2. Description of the Related Art

A display apparatus is an apparatus designed to display visual and stereoscopic image information, and a bezel is a bracket that is provided with a square cross-section and serves to fix a display panel of a display apparatus.

For example, the display apparatus not only includes a television (TV) and a monitor, but also includes various forms of other devices, for example, a portable multimedia device, such as a digital broadcasting terminal, a personal digital assistant (PDA), or a portable multimedia player (PMP); and a portable communication device, such as a smart phone or a wearable device.

A display panel may be divided into an emissive display panel that emits light by itself and a non-emissive display panel that does not emit light by itself.

In recent years, flat panel display panels have been developed that may easily realize a large-scale image and a flat screen with less spatial limitation due to a reduced weight and volume, which are constraints of cathode ray tubes (CRTs), and also thin thickness, light weight or multi-functions of display apparatuses have been achieved.

Accordingly, circuit components, such as system IC chips, come to have higher electrostatic sensitivity, so there is a need for preventing electrostatic discharge (ESD), a phenomenon in which charges move between two objects.

Such an ESD may damage internal components of the display apparatus during assembly production or use of a product, so that the display apparatus may not be normally driven.

Accordingly, a bezel including metal material may be used to provide the display apparatus with conductivity to prevent ESD from occurring. However, the bezel including metal material has a high specific gravity, causes difficulty in achieving lightweight of the display apparatus.

In addition, in order to provide the display apparatus with conductivity to prevent ESD, the bezel may include a resin of plastic in which a carbon component is contained. However, such a carbon-contained resin bezel is expensive and has limitation in being applied to products.

Meanwhile, a conductive tape may be attached to a non-conductive bezel to provide the display apparatus with conductivity to prevent ESD from occurring. However, in the non-conductive bezel, the conductive tape needs to be attached after the assembling process of the non-conductive bezel, which requires an additional process, resulting in lower productivity and additional costs.

SUMMARY

Therefore, it is an object of the disclosure to provide a display apparatus including an improved bezel coated with a conductive adhesive to omit a process of attaching a conductive tape.

It is another object of the disclosure to provide a display apparatus including an improved bezel coated with a conductive adhesive including carbon nanotubes (CNTs).

Additional aspects of the disclosure will be set forth in part in the description which follows and, in part, will be obvious from the description, or may be learned by practice of the disclosure.

Therefore, it is an aspect of the disclosure to provide a display apparatus including: a display panel on which an image is to be displayed; a chassis arranged at a rear side of the display panel and including a conductive material; a bezel configured to support the display panel and including a non-conductive material; and an adhesive including a conductive material and coated on an inner side surface of the bezel such that static electricity is guided away from being discharged toward an inside of the display apparatus.

The adhesive may include carbon.

The adhesive may include carbon nanotubes (CNTs).

The adhesive may include 5 to 8 wt % of the CNTs.

The adhesive may include a polyurethane (PU)-based resin to mitigate an impact applied to the display panel.

The adhesive may include 70 to 75 w % of the polyurethane (PU)-based resin.

The bezel may include a frame configured to support a front surface of the display panel and sidewalls protruding from the frame to cover lateral surfaces of the display panel, wherein the adhesive may include a first adhesive coated on a rear surface of the frame facing the front surface of the display panel.

The first adhesive may be coated on a periphery of the frame that makes contact with the display panel to protect the display against electrostatic discharge (ESD).

The first adhesive may be continuously coated without being disconnected at a corner of the frame.

The adhesive may further include a second adhesive coated on the sidewalls facing the chassis such that the adhesive is grounded through the chassis.

The adhesive may further include a third adhesive coated on the rear surface of the frame to connect the first adhesive to the second adhesive.

The bezel may further include a guide portion configured to guide coating of the adhesive.

The guide portion may include a guide groove configured to receive the adhesive.

The guide portion may include a sidewall guide portion provided on the sidewall to guide coating of the second adhesive and a frame guide portion provided on the rear surface of the frame to guide coating of the third adhesive.

The guide portion may include a periphery guide portion provided on a periphery of the frame to guide coating of the first adhesive.

It is another aspect of the disclosure to provide a display apparatus including: a display panel on which an image is displayed; a bezel configured to support the display panel and including a non-conductive material; and an adhesive coated on an inner side surface of the bezel, where the adhesive includes a carbon nanotube (CNT) having conductivity to guide static electricity from being discharged toward the display panel and a polyurethane (PU)-based resin provided to mitigate an impact applied to the display panel.

The bezel may include a frame arranged at a front side of the display panel and sidewalls protruding from the frame rearward, wherein the adhesive may be continuously coated on a rear surface of the frame facing a front surface of the display panel and the sidewalls facing lateral surfaces of the display panel.

The bezel may include a guide portion provided to guide coating of the adhesive.

It is another aspect of the disclosure to provide a display apparatus including: a display panel on which an image is displayed; a chassis arranged at a rear side of the display panel and including a conductive material; a bezel including a frame configured to support a front surface of the display panel and sidewalls protruding from the frame to cover lateral surfaces of the display panel. The display apparatus includes an adhesive including a carbon nanotube (CNT) having conductivity to guide static electricity from being displayed toward an inside of the display apparatus and coated on an inner side surface of the bezel, wherein the adhesive may include a first adhesive coated on a rear surface of the frame facing the front surface of the display panel, a second adhesive coated on the sidewalls facing the chassis to ground the adhesive through the chassis, and a third adhesive coated on the rear surface to connect the first adhesive to the second adhesive.

The adhesive may include a polyurethane (PU)-based resin to mitigate an impact applied to the display panel.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
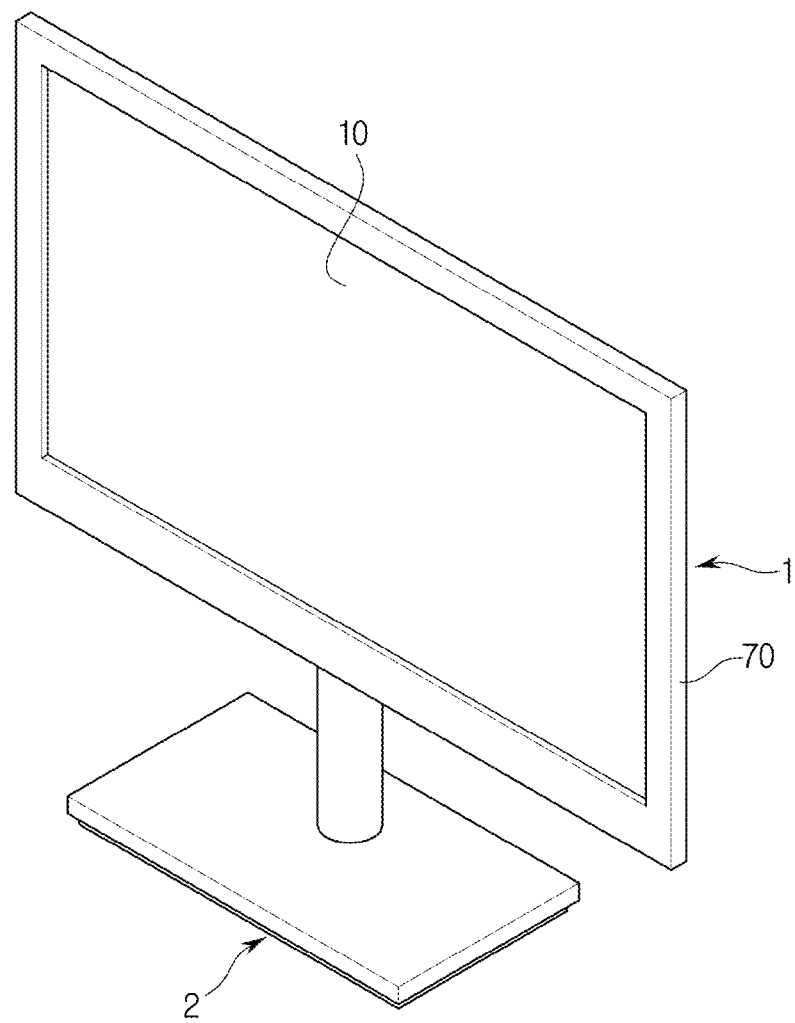
FIG. 1 is a perspective view illustrating a display apparatus according to the disclosure.

The embodiments set forth herein and illustrated in the configuration of the disclosure are only the most preferred embodiments and are not reactive of the full the technical spirit of the disclosure, so it should be understood that they may be replaced with various equivalents and modifications at the time of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise.

It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another.

For example, a first element could be termed a second element, and, similarly, a second element could be termed a first element, without departing from the scope of the disclosure. Descriptions shall be understood as to include any and all combinations of one or more of the associated listed items when the items are described by using the conjunctive term "~ and/or ~," or the like.

The terms "front", "rear", "upper", "lower", "top", and "bottom" as herein used are defined with respect to the drawings, but the terms may not restrict the shape and position of the respective components.

Hereinafter, embodiments according to the disclosure will be described in detail with reference to the accompanying drawings.

Figure 2:
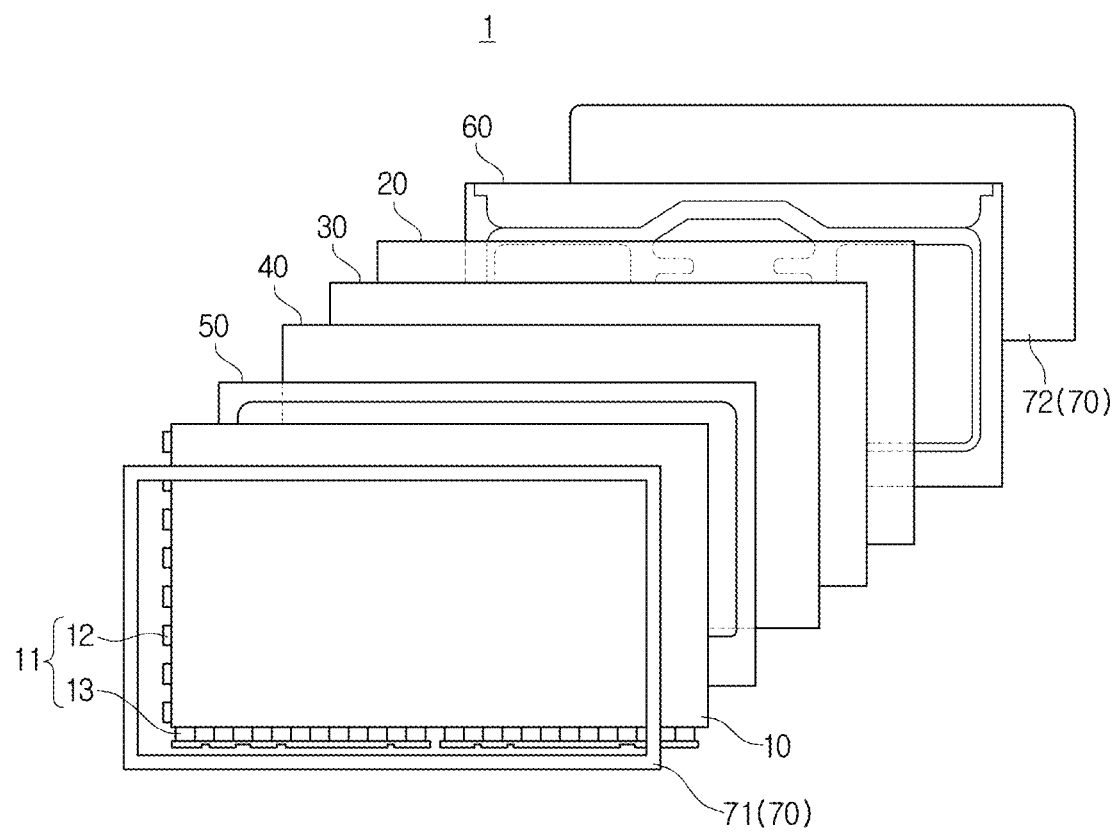
FIG. 2 is an exploded view illustrating the display apparatus according to the disclosure.
Figure 3:
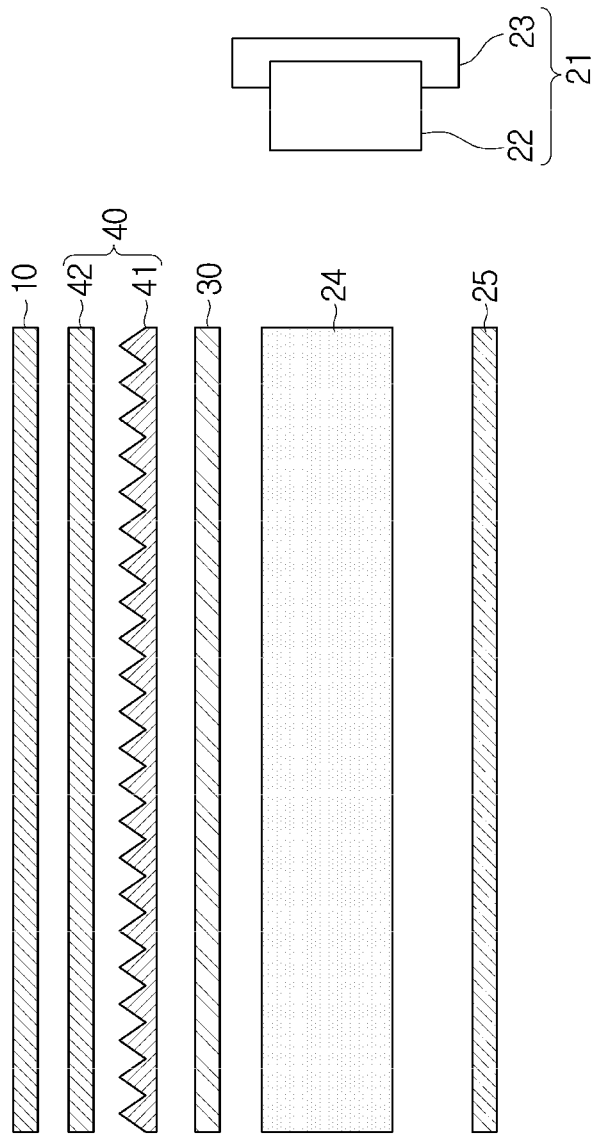
FIG. 3 is a cross-sectional view illustrating the display apparatus according to the disclosure.

FIG. 1 is a perspective view illustrating a display apparatus 100 according to the disclosure, FIG. 2 is an exploded view illustrating the display apparatus 100 according to the disclosure, and FIG. 3 is a cross-sectional view illustrating the display apparatus 100 according to the disclosure.

Referring to FIGS. 1 to 3, the display apparatus 1 may include an image displaying device, such as a television, a monitor, and a display device of a mobile communication terminal.

The display apparatus 1 may display an image and output a sound. Here, sound may be output through a device provided at an outside of the display apparatus 1. The display apparatus 1 may be supported by a stand 2 mounted at a lower end of the display apparatus 1, and may be installed on the wall by a separate bracket or the like.

The following description will be made in relation to a liquid crystal display (LCD) that allows an image to be visualized through a display panel 10 by adjusting the transmittance of light emitted from a backlight unit, as an example of the display apparatus according to the disclosure, among the above described display apparatuses. However, the disclosure is not limited thereto.

The display apparatus 1 may include a display panel 10, a backlight unit 20, a diffusion plate 30, an optical sheet 40, a support member 50, a chassis 60, and a housing 70.

The display panel 10 is a panel for displaying image information, such as texts, numbers, arbitrary icons, and the like by adjusting the transmittance of light passing through a liquid crystal layer. The display panel 10 may include a large-scale panel having a size of about 60 inches or greater. Here, the transmittance of light passing through the liquid crystal layer may be adjusted according to the intensity of an applied voltage.

The display panel 10 may include a color filter array panel, a thin film transistor array panel (TFT panel), a liquid crystal layer, and a sealant. Here, the color filter panel and the TFT panel may be formed of glass.

The color filter panel may include red, green, and blue filters formed in a region corresponding to a pixel electrode of the TFT panel so that a color is displayed for each pixel. A common electrode formed of transparent conductive material, such as indium tin oxide (ITO) or indium zinc oxide (IZE), may be formed on the color filter panel.

The TFT panel of the display panel 10 may be disposed to be spaced apart from the color filter panel, and may include a plurality of gate lines, data lines, and pixel electrodes.

The gate lines are arranged in the horizontal direction and transmit gate signals. The data lines are arranged in the vertical direction to transmit data signals. The pixel electrode is connected to the gate line and the data line, and includes a switching device and a storage capacitor.

The switching device may be formed at an intersection of the gate line and the data line, and one end of the storage capacitor may be connected to an output terminal of the switching device. The other terminal of the storage capacitor may be connected to a common voltage or to the gate line.

The display panel 10 may include a liquid crystal layer disposed between the color filter panel and the TFT panel. The liquid crystal layer may include a sealing material and liquid crystals accommodated in the sealing material. The liquid crystal layer may have an alignment direction that is changed by a voltage applied from the outside. At this time, the transmittance of light passing through the liquid crystal layer may be adjusted.

The color filter panel, the TFT panel, and the liquid crystal layer of the display panel 10 may form a liquid crystal capacitor, and the liquid crystal capacitor may be connected to the output terminal of the switching device of the pixel electrode and a common voltage or reference voltage.

The sealant may be formed on peripheries of the color filter panel and the TFT panel of the display panel 10, and couple the color filter panel to the TFT panel. The sealant may be provided to maintain the shape of the display panel 10.

The display panel 10 may include an image driving unit 11 configured to drive an image. The image driving unit 11 may include a first image driving unit 12 for driving an X electrode and a second image driving unit 13 for driving a Y electrode. The image driving unit 11 (image driving member) may be implemented as hardware, software or any combination thereof to drive an image.

Here, the X electrode may include a source electrode and the Y electrode may include a gate electrode. The first image driving unit 12 and the second image driving unit 13 may be connected to a driving module.

The first image driving unit 12 may select a gray voltage for each data line on the basis of image data, and transmit the selected gray voltage to the liquid crystal through the data line.

The second image driving unit 13 may transmit an on-off signal based on image data to a thin film transistor (TFT), which is a switching device, through the scan line, and turn on or off the TFT.

That is, when a voltage corresponding to each color value is supplied by the first image driving unit 12, the second image driving unit 13 may supply the corresponding voltage to the corresponding pixel.

A source electrode of the TFT is connected to the data line, a gate electrode of the TFT is connected to the scan line, and a drain electrode of the TFT is connected to the pixel electrode of indium tin oxide (ITO). The TFT is turned on when a scan signal is supplied through the scan line to supply a data signal supplied from the data line to the pixel electrode.

A predetermined voltage is applied to the common electrode, so that an electric field may be formed between the common electrode and the pixel electrode. The angle of alignment of liquid crystal molecules in between the display panel 10 may be changed by the electric field, and the light transmittance is changed according to the angle of alignment so that a desired image may be displayed.

The driving module supplies the gate line and the data line formed on the TFT panel with a gate driving signal and a data driving signal based on a gate control signal, a data control signal, and a data signal related to the gate control signal, and the data control signal, to implement a desired image on the display panel 10.

The backlight unit 20 may include an edge type LED light source device as a light source device that emits light from a lateral side of the display panel 10. The backlight unit 20 may include a plurality of optical modules 21, and a light guide plate 24 and a reflective sheet 25 that are disposed between the plurality of optical modules 21.

The plurality of optical modules 21 may include a light source unit 22 outputting light and a light source driving unit 23 driving the light source unit 22 for the light source unit 22 to output light. Here, the light source unit 22 may include a light emitting diode (LED) that generates light with high efficiency and low power.

The light source driving unit 23 may be configured to supply or cut off electric power applied to LEDs or adjust the magnitude of the electric power supplied to the LEDs, and may include a printed circuit board (PCB) on which a plurality of LEDs are electrically mounted.

The light guide plate 24 guides incident light to the display panel 10, and may be provided in a flat type including plastic material, such as polymethylmethacrylate (PMMA), which is an acrylic transparent resin serving as a light transmitting material capable of transmitting light, or a polycarbonate (PC)-based material.

The light guide plate 24 is excellent in transparency, weather resistance, and coloring property, and may allow light diffusion when light is transmitted through the light guide plate 24.

The reflective sheet 25 may be disposed adjacent to the light guide plate 24 and may reflect light provided from the lateral side of the light guide plate 24 to the lateral side of the light guide plate 24.

The diffusion plate 30 includes a semi-transparent panel that is positioned between the display panel 10 and the backlight unit 20 and diffuses light emitted from the backlight unit 20 to have planar emission of light so that uniform color and brightness uniform is achieved throughout the screen.

The diffusion plate 30 may improve the brightness of light emitted from the backlight unit 20 and supply the light to the display panel 10. That is, the diffusion plate 30 may augment light of LEDs of the backlight unit 20 and keep the brightness of the entire surface uniform.

The optical sheet 40 is a sheet disposed between the display panel 10 and the diffusion plate 30, and includes a prism sheet 41, on which prisms are formed, and a reflective polarization sheet 42 (DBEF: Dual Brightness Enhancement Film: DBEF) formed by multilayer coating of double refraction.

The prism sheet 41 may include a triangular prism-shaped prism pattern, and a plurality of the prism patterns may be arranged adjacent to each other in the form of a plurality of strips. In other words, the prism pattern according to an embodiment is a pattern in which a crest and a trough are repeatedly arranged in a line while protruding from a reference surface toward the display panel 10.

The prism patterns of the prism sheet 41 may be arranged to cross lens patterns of a lens portion of the light guide plate 24 when viewed in a vertical direction.

The reflective polarization sheet 42 may include a sheet that reflects part of light to be absorbed in a polarizing plate (not shown) disposed on the front and rear surfaces of the display panel 10 and provides the reflected light to the polarizing plate again.

The reflective polarization sheet 42 may transmit some of incident light while reflecting the remaining. In this case, the reflected light may be recycled as scattered light by the diffusion plate 30 and the prism sheet 41.

Some of the recycled scattered light passes through the reflective polarization sheet 42 again, and the remaining is reflected again, so that the recycling of light may be continuously repeated. According, the optical loss may be minimized. That is, the reflective polarization sheet 42 may recycle polarization which has not passed through the polarizing plate (not shown) so that the light efficiency is improved.

The optical sheet 40 may improve light characteristics by making brightness of light output from the light guide plate 24 uniform, and collecting diffused light or high brightness light so that the display panel 10 is provided with light having improved light characteristics.

The support member 50 may support the display panel 10, the diffusion plate 30, the optical sheet 40, and the chassis 60. The support member 50 may maintain the distance between the display panel 10 and the diffusion sheet 40, the distance between the diffusion plate 30 and the optical sheet 40, and the distance between the diffusion plate 30 and the backlight unit 20.

The chassis 60 is a panel for connecting various components required for image display and sound output, and various PCBs, input/output devices, and the like may be mounted on the chassis 60.

The chassis 60 may be disposed at a rear side of the display panel 10. The chassis 60 may be disposed between the backlight unit 20 and a housing cover 72.

The chassis 60 may be formed of metal having excellent heat dissipation and strength. A driving module for driving the display panel 10 and the backlight unit 20 may be disposed in the chassis 60. The chassis 60 may be formed of a conductive material.

The housing 70 may include a bezel 71 and a housing cover 72. The bezel 71 may support the display panel 10. The bezel 71 may secure the display panel 10 supported by the support member 50, and may be detachably coupled to the support member 50 or the housing cover 72.

The bezel 71 may form a receiving space in combination with the housing cover 72, and the display panel 10, the backlight unit 20, the diffusion plate 30, the optical sheet 40, the chassis 60, and the like may be disposed in the receiving space.

The bezel 71 may be formed of a non-conductive material. The bezel 71 may include a plastic resin or the like. However, the material forming the bezel 71 is not limited thereto.

Figure 4:
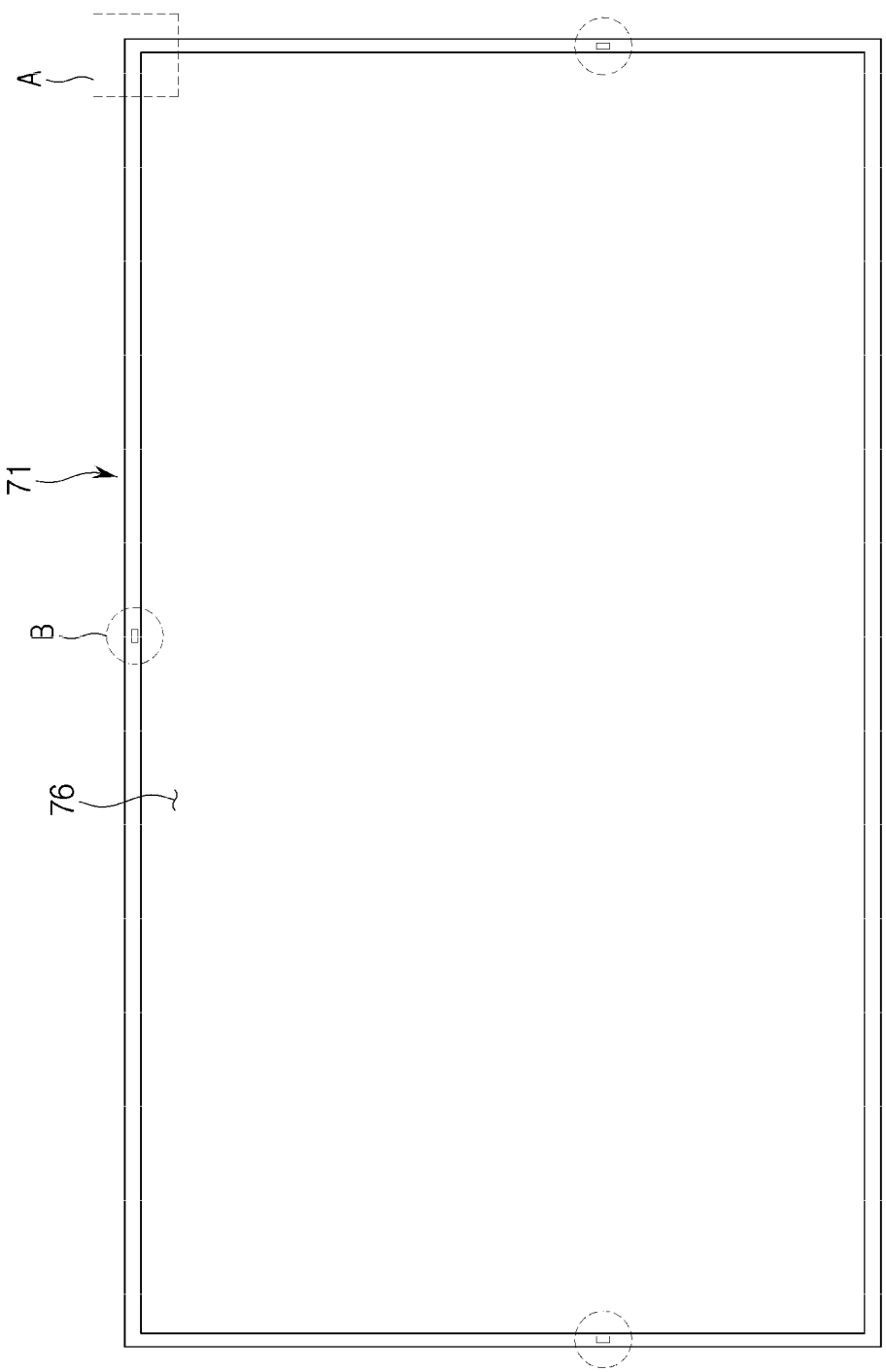
FIG. 4 is a view illustrating a rear surface of a bezel according to the disclosure.
Figure 5:
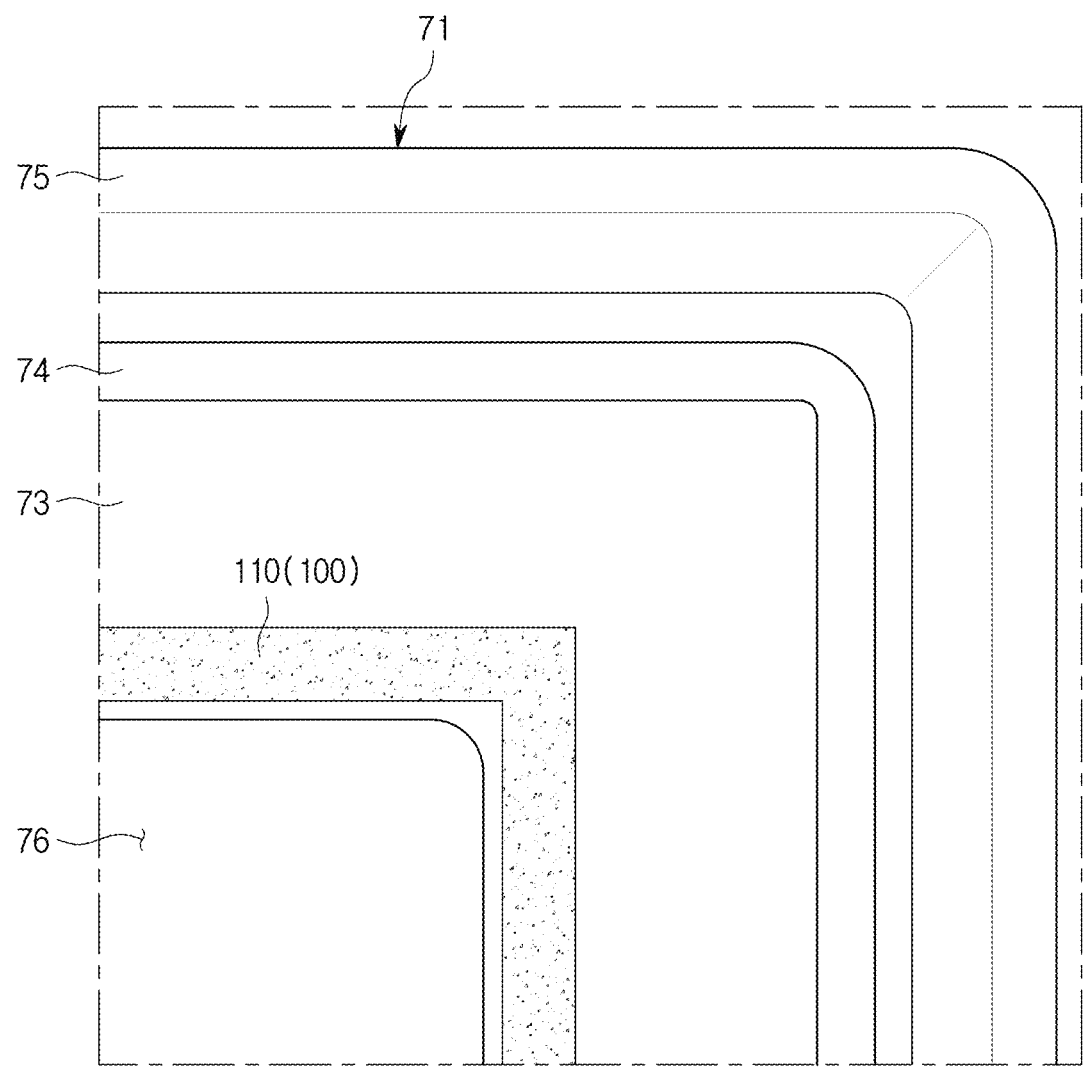
FIG. 5 is an enlarged view illustrating a corner of the rear surface of the bezel according to the disclosure, which is part A of FIG. 4.
Figure 6:
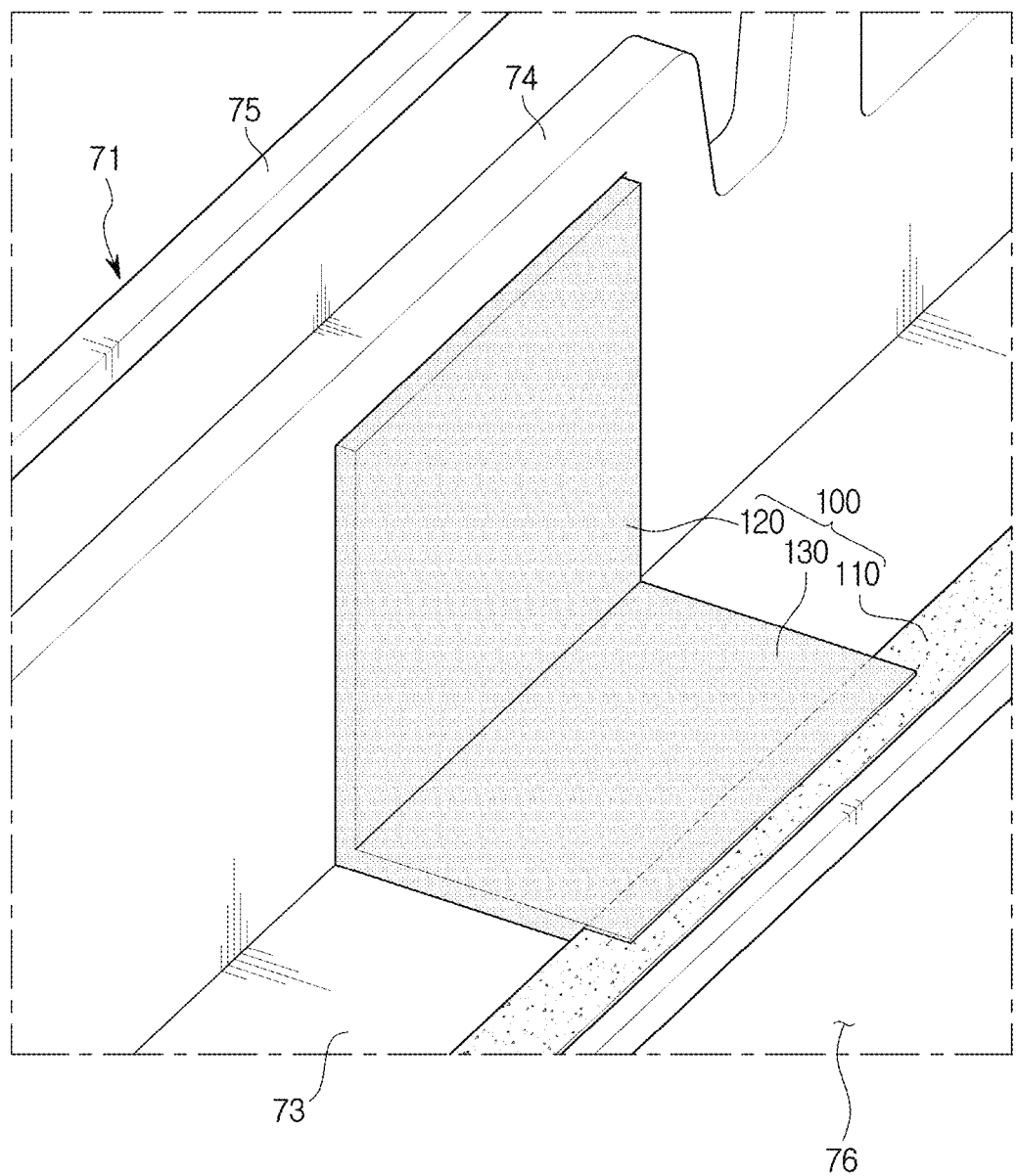
FIG. 6 is an enlarged view illustrating a state where an adhesive is coated on a frame and sidewalls of the bezel according to the disclosure, which is part B in FIG. 4.

FIG. 4 is a view illustrating a rear surface of a bezel according to the disclosure, FIG. 5 is an enlarged view illustrating a corner of the rear surface of the bezel according to the disclosure, which is part A of FIG. 4, and FIG. 6 is an enlarged view illustrating a state where an adhesive is coated on a frame and sidewalls of the bezel according to the disclosure, which is part B in FIG. 4.

Referring to FIGS. 4 to 6, the display apparatus (1 in FIG. 2) according to the disclosure may include the adhesive 100 formed of a conductive material to prevent static electricity from being discharged into the interior of the display apparatus 1 and coated on an inner side surface of the bezel 71.

As the display apparatus 1 becomes multifunctional, electrostatic discharge (ESD), which is a phenomenon of charge movement between internal components, may occur in the display apparatus 1.

When static electricity is discharged to the inside of the display apparatus 1, the internal components of the display apparatus 1, such as the display panel 10, are damaged during assembly production or use of the display apparatus 1, and thus the display apparatus may not be normally driven.

Generally, a bezel including metal material may be used to provide a display apparatus with conductivity to thereby prevent static electricity from being discharged to the inside of the display apparatus. However, the bezel including metal material has a high specific gravity, and causes difficulty in reducing the weight of the display apparatus.

In order to make up for such a constraint, the bezel may be formed using a resin of plastic and the like in which a carbon component is contained, rather than using a metal. However, the bezel formed of a resin containing a carbon component is expensive, and has limitation to be applied to all types of display apparatuses.

In order to make up for such a constraint, the bezel may be formed of a non-conductive material using a resin of plastic and the like, rather than a metal, and a conductive tape may be additionally attached to an inner side surface of the bezel.

Such an additional process of attaching the conductive tape after the assembly process of the bezel involves a manual process, so that the number of processes and the manufacturing time are increased, which may lower the productivity and incur additional costs.

Accordingly, the display apparatus 1 according to the disclosure may include the adhesive 100 formed of a conductive material and coated on the inner side surface of the bezel 71 to prevent static electricity from being discharged to the interior of the display apparatus 1.

The display apparatus 1 according to the disclosure includes the conductive adhesive 100, which is coated on the bezel 71, replacing a separate conductive tape to thereby prevent an environmental hazardous material from being discharged due to using a conductive tape including a fabric substrate.

In addition, while the attaching of the conductive tape to the bezel requires a manual process, the coating of the conductive adhesive 100 on the bezel 71 for the display apparatus 1 according to the disclosure employs an apparatus for automatically coating the adhesive 100 to the bezel 71, and automation of the production process may ensure constant production quality.

To this end, the adhesive 100 according to the disclosure may include carbon to have conductivity. The carbon-based conductive adhesive may include carbon fiber, carbon nanotubes (CNTs), carbon black, or the like.

The adhesive 100 according to the disclosure may particularly include carbon nanotubes (CNTs) to have conductivity.

A carbon nanotube is formed by rolling graphene of covalently-bonded carbon atoms in a hollow tube structure having a nano-sized diameter.

The carbon nanotube may be classified into a single-walled carbon nanotube, a double-walled carbon nanotube, a multi-walled carbon nanotube, and a rope carbon nanotube depending on the number of walls composed by the graphene.

The carbon nanotube may be synthesized by various methods, such as an arc-discharge, a laser vaporization, a plasma enhanced chemical vapor deposition, a thermal chemical vapor deposition, or vapor phase growth.

The carbon nanotubes have electrical conductivity, but are likely to cohere with each other by a van der Waals force, which causes difficulty in achieving uniform dispersion, and provides poor mechanical properties.

Accordingly, on the basis of 100 parts by weight of the adhesive 100, when the content of carbon nanotubes is less than 1 part by weight, the electrical conductivity may be poor, and when the content of carbon nanotubes is more than 10 parts by weight, the electrical conductivity may be excellent but the molding characteristics may be poor.

The adhesive 100 according to the disclosure may contain 5 to 8 parts by weight of carbon nanotubes per 100 parts by weight of the adhesive 100. However, the content of carbon nanotubes is not limited thereto.

The adhesive 100 according to the disclosure may contain 1 to 2 parts by weight of graphite per 100 parts by weight of the adhesive 100. However, the content of graphite is not limited thereto.

Graphite may be included in a mineral belonging to a hexagonal system having the same crystal structure as that of crystallized quartz, and may have a black color and metallic luster. Graphite may be used for an electric conductor, a pencil lead, a crucible, an electric furnace, an arc electrode, and the like, and may also be used as a lubricating substance.

The bezel 71 includes a frame 73 for supporting a front surface of the display panel 10 and a bezel cover 75 forming a lateral side of the display apparatus 1 and protruding from the frame 73 to be coupled to the housing cover (72 in FIG. 2).

The bezel 71 may include an opening 76 for opening the front surface of the display panel 10 and sidewalls 74 protruding from the frame 73 to cover lateral surfaces of the display panel 10.

The sidewall 74 may be disposed at an inside of the bezel cover 75. The sidewall 74 may be disposed between the opening 76 and the bezel cover 75.

The adhesive 100 may include a first adhesive 110 coated on a rear surface of the frame 73 facing the front surface of the display panel 10. The first adhesive 110 may be coated near an inner edge side of the frame 73. The first adhesive 110 may be coated near a periphery of the opening 76. However, the position of the adhesive 100 is not limited thereto.

The first adhesive 110 may be coated along the periphery of the frame 73 that makes contact with the display panel (10 in FIG. 2) to protect the display panel (10 in FIG. 2) from ESD.

In general, a conductive tape attached to a bezel may be difficult to be bent at a corner of the bezel, so that a plurality of the conductive tapes may be successively attached without continuity.

Accordingly, parts of the plurality of conductive tapes may overlap each other at the corner of the bezel, which leads to increase in local thickness, so that the slimming of the display apparatus may be limited.

When a plurality of conductive tapes are attached to the bezel without overlapping each other to make up for the constraint, a fine gap may be formed between the plurality of conductive tapes at the corner of the bezel, so that the effect of preventing ESD may be lowered.

Accordingly, the first adhesive 110 according to the disclosure may be continuously coated without being disconnected at the corner of the frame 73.

Since the adhesive 100 according to the disclosure employs a coating method rather than an attachment of a separate tape, the adhesive 100 may be continuously coated without being disconnected even at the corner of the bezel 71. The adhesive 100 according to the disclosure may not be disconnected at the corner of the bezel 71 while preventing the bezel 71 from being locally thicker.

The adhesive 100 may include a second adhesive 120 coated on the sidewalls 74 that face the chassis 60 such that the adhesive 100 is grounded through the chassis 60. The adhesive 100 may include a third adhesive 130 coated on the rear surface of the frame 73 to connect the first adhesive 110 to the second adhesive 120.

The second adhesive 120 coated on the sidewall 74 may be connected to the chassis 60. The chassis 60 may be formed of a metal material to ground the display apparatus 1. Accordingly, static electricity generated in the internal components of the display apparatus 1 is prevented from being discharged to the interior of the display apparatus 1.

That is, the static electricity generated in the internal components of the display apparatus 1 is not discharged to the display panel 10 or the like, and sequentially passes through the first adhesive 110, the third adhesive 130, the second adhesive 120, and the chassis 60, and then discharged to the outside of the display apparatus 1.

The first adhesive 110, the second adhesive 120, and the third adhesive 130 may be integrally formed with each other and continuously coated.

The second adhesive 120 and the third adhesive 130 each may be coated on the bezel 71 in a plurality of units thereof. In FIG. 4, the second adhesive 120 and the third adhesive 130 are illustrated as being coated on a total of three areas including opposite sides and an upper side of the bezel 71 having a quadrangular shape, but the coating positions of the second and third adhesives 120 and 130 are not limited thereto.

That is, the second adhesive 120 and the third adhesive 130 may be coated on a total of four areas including opposite sides, an upper side, and a lower side of the bezel 71 having a quadrangular shape, or may be coated in a plurality of units thereof on at least one of the opposite sides, the upper side, and the lower side of the bezel 71.

The adhesive 100 according to the disclosure may include a polyurethane (PU)-based resin to mitigate an impact applied to the display panel 10.

Polyurethane, which is not a thermosetting resin, is a plastic having a three-dimensional structure similar to that of a thermosetting resin. Polyurethane has an excellent toughness and chemical resistance.

Polyurethane may have used in various applications. Polyurethanes may be used for electrical insulators, structural materials, bubble insulation, bubble cushions, or elastic fibers, and may be used as a substitute for rubber due to superior elasticity.

As an example, the polyurethane may be used for synthetic fibers or paints. Synthetic fibers are often referred to as spandex, and are used for underwear, socks, and swimwear by being covered with fibers of nylon. In addition, paints using polyurethane (polyurethane resin (paint)) may have strong adhesion, waterproof property, and corrosion resistance.

Polyurethane has a bubble structure, and thus may be elastic, firm and light. Accordingly, polyurethane may be used not only for mattresses and fabrics but also for a paddle of an airplane wing.

The adhesive 100 according to the disclosure, including a polyurethane-based resin, may serve as a buffer with elasticity, so that a separate buffer may not be additionally used unlike in the case of attaching a conductive tape.

In the case of attaching a conductive tape to a bezel, a buffer is additionally attached to the bezel separately from the conductive tape, forming a multi-layer structure. However, the adhesive 100 according to the disclosure may form a single-layer structure by including a polyurethane resin in the adhesive 100.

That is, the adhesive 100 according to the disclosure has conductivity by including a carbon nanotube and also serves as a buffer by including a polyurethane-based resin, in other words, forming a single-layer structure capable of performing the two functions. Accordingly, the adhesive 100 may contribute to slim thickness of the display apparatus 1.

The adhesive 100 according to the disclosure may contain 70 to 75 parts by weight of a polyurethane-based resin per 100 parts by weight of the adhesive 100. However, the content of the polyurethane-based rein is not limited thereto.

The adhesive 100 according to the disclosure may further contains 15 to 20 parts by weight of methyl ethyl ketone per 100 parts by weight of the adhesive 100, and may contain less than 1 part by weight of additives. However, the contents of methyl ethyl ketone and the additives are not limited thereto.

Methyl ethyl ketone is an alcohol oxide that may be used as a solvent in the industrial process or as a material in the synthetic rubber industry. Methyl ethyl ketone may serve as an excellent solvent for nitrocellulose, vinyl resin, or cellulose acetate.

Figure 7:
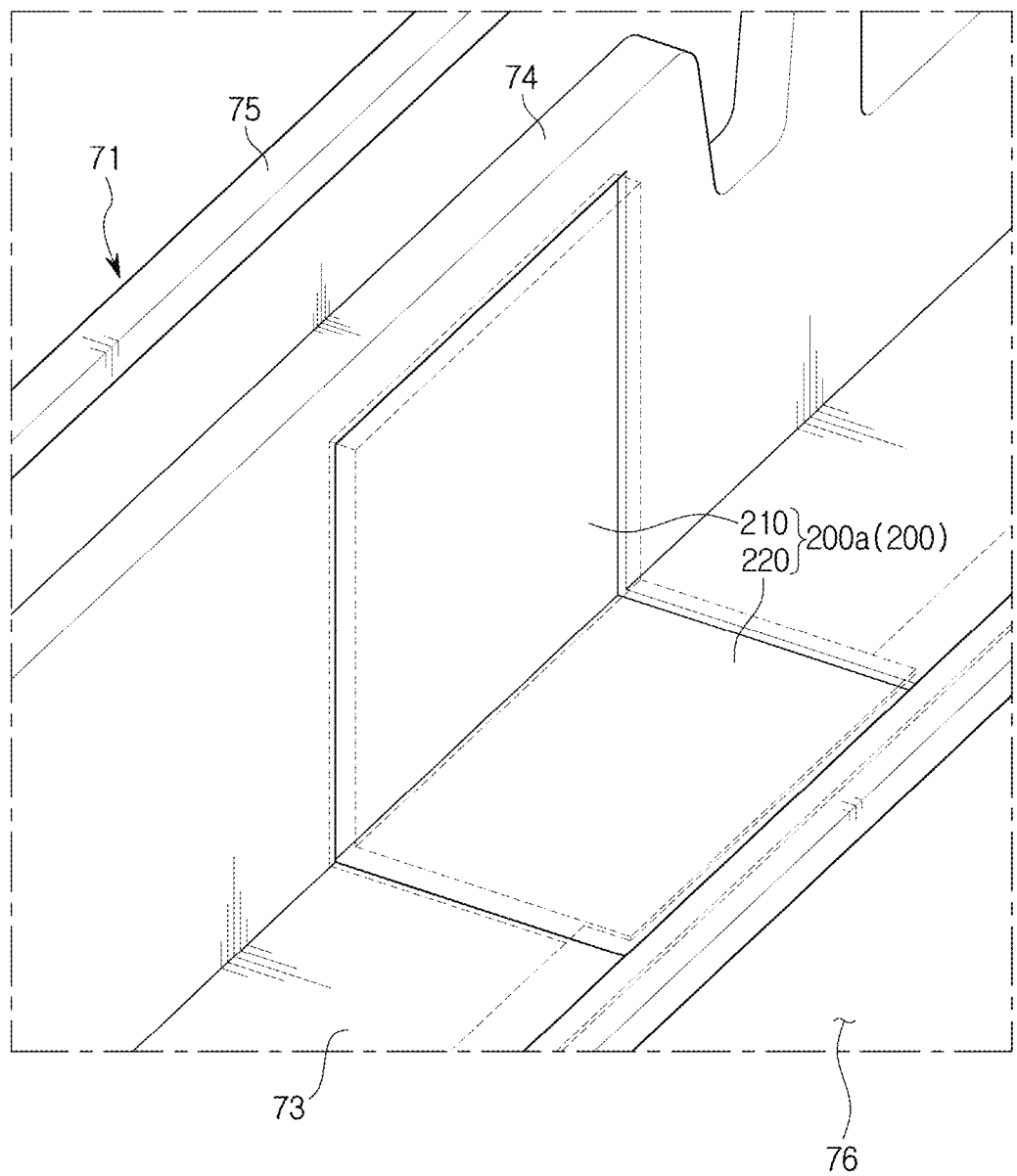
FIG. 7 is a view illustrating a guide portion provided to guide an adhesive coated on the bezel according to the disclosure.
Figure 8:
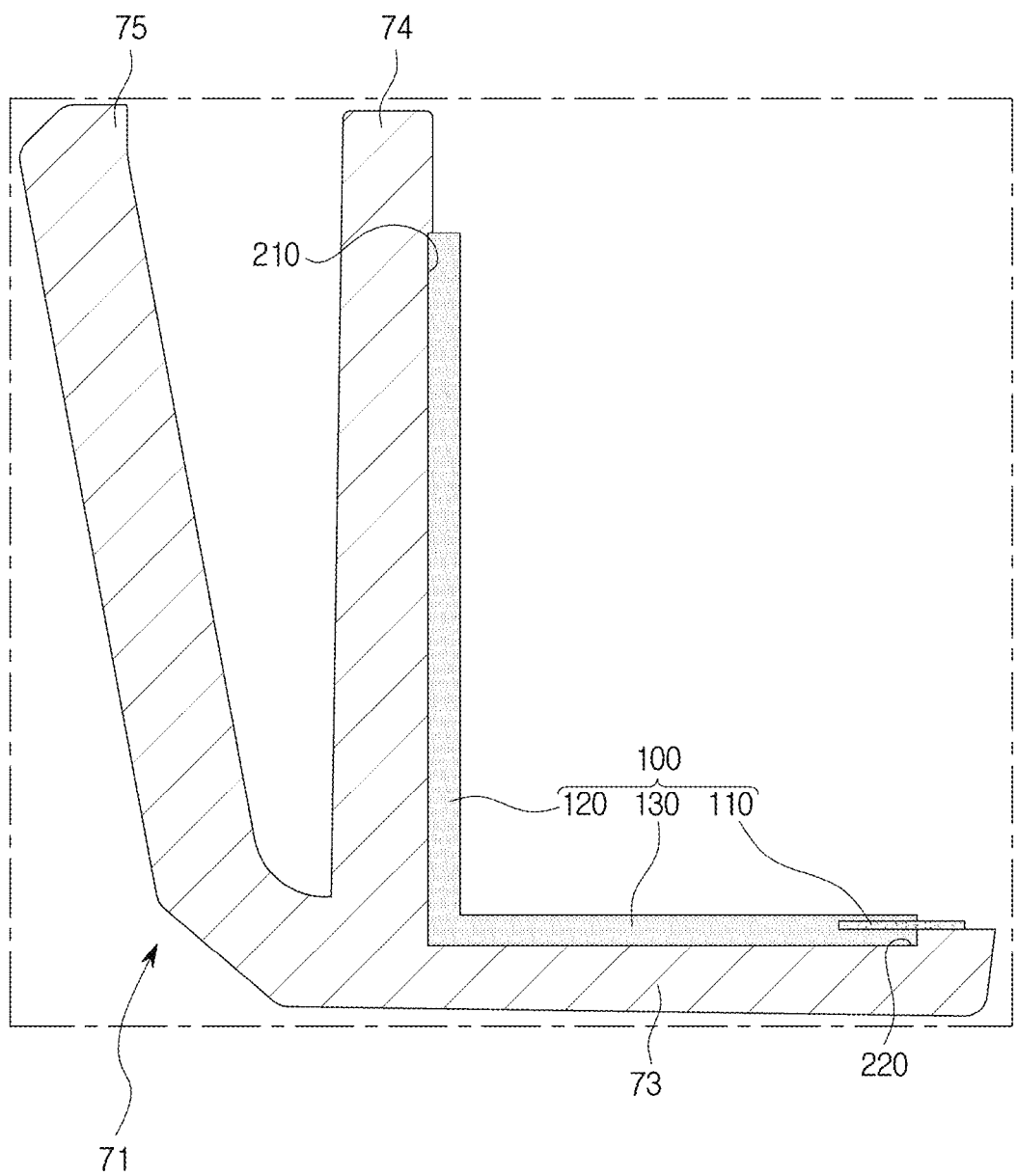
FIG. 8 is a side cross-sectional view illustrating a state where an adhesive is coated on the frame and sidewalls of the bezel according to the disclosure.

FIG. 7 is a view showing a guide portion 200 provided to guide an adhesive coated on the bezel according to the disclosure, and FIG. 8 is a side cross-sectional view illustrating a state where an adhesive is coated on the frame and sidewalls of the bezel according to the disclosure.

Referring to FIGS. 7 and 8, the bezel 71 according to the disclosure may include the guiding portion 200 provided to guide coating of the adhesive 100. The guide portion 200 may include a guide groove 200a provided to receive part of the adhesive 100.

However, the disclosure is not limited thereto, and the guide portion 200 may be provided in various structures as long as it can guide coating of the adhesive 100.

The guide portion 200 may include a sidewall guide portion 210 provided in the sidewall 74 to guide coating of the second adhesive 120 and a frame guide portion 220 provided in the rear surface of the frame 73 to guide coating of the third adhesive 130.

The sidewall guide portion 210 and the frame guide portion 220 may be connected to each other. The sidewall guide portion 210 and the frame guide portion 220 may be integrally formed with each other.

The sidewall guide portion 210 and the frame guide portion 220 each may be provided in a plurality of units thereof in the bezel 71. In FIG. 4, the sidewall guide portion 210 and the frame guide portion 220 are illustrated as being provided on a total of three areas including opposite sides and an upper side of the bezel 71 having a quadrangular shape, but the positions of the sidewall guide portion 210 and the frame guide portion 220 according to the disclosure are not limited thereto.

That is, the sidewall guide portion 210 and the frame guide portion 220 may be provided on a total of four areas including opposite sides, an upper side, and a lower side of the bezel 71 having a quadrangular shape, or may be provided in a plurality of units thereof on at least one of the opposite sides, the upper side, and the lower side of the bezel 71.

In FIG. 8, the first adhesive 110 is illustrated as being coated to be inserted into the third adhesive 130, but the disclosure is not limited thereto.

That is, the first adhesive 110 and the third adhesive 130 shown in FIG. 8 have a structure in which the third adhesive 130 is coated along the frame guide portion 220, the first adhesive 110 is coated on an inner edge side of the frame 73 to be connected to the third adhesive 130, and then the third adhesive 130 is coated on the first adhesive 110 again. However, the coating structure of the first and second adhesives 110 and 130 according to the disclosure is not limited thereto.

The first adhesive 110 and the third adhesive 130 are coated such that the height of the first adhesive 110 is higher than the height of the third adhesive 130 in a direction in which the sidewall 74 protrudes from the frame 73, or such that the height of the first adhesive 110 is equal to the height of the third adhesive 130 in the direction.

Figure 9:
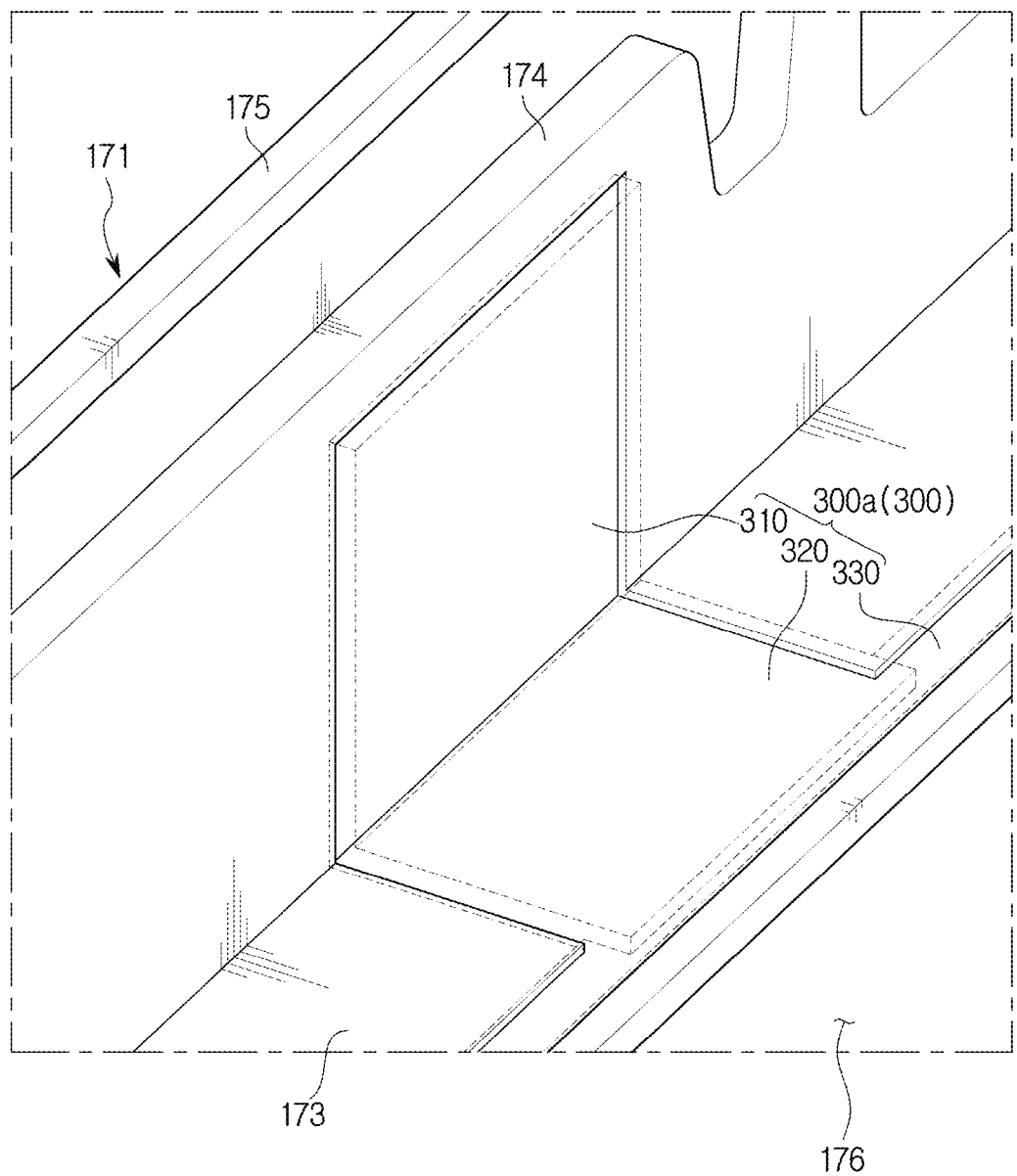
FIG. 9 is a view illustrating a guide portion provided to guide an adhesive coated on a bezel according to another embodiment of the disclosure.

FIG. 9 is a view illustrating a guide portion provided to guide an adhesive coated on a bezel 171 according to another embodiment of the disclosure.

Referring to FIG. 9, the bezel 171 according to the embodiment of the disclosure includes a frame 173 for supporting a front surface of a display panel (10 in FIG. 2) and a bezel cover 175 forming a lateral side of a display apparatus (1 in FIG. 1) and protruding from the frame 173.

The bezel 171 may include an opening 176 for opening the front surface of the display panel 10 and sidewalls 174 protruding from the frame 173 to cover lateral surfaces of the display panel 10.

The bezel 171 according to the embodiment of the disclosure may include a guide portion 300 provided to guide coating of an adhesive 100. The guide portion 300 may include a guide groove 300a provided to receive the adhesive 100.

However, the structure of the guide portion 300 according to the disclosure is not limited thereto, and may be provided in various structures as long as it can guide coating of the adhesive 100.

The guide portion 300 may include a sidewall guide portion 310 provided in the sidewall 174 to guide coating of a second adhesive (120 in FIG. 7) and a frame guide portion 320 provided in a rear surface of the frame 173 to guide coating of a third adhesive (130 in FIG. 7).

The sidewall guide portion 310 and the frame guide portion 320 may be connected to each other. The sidewall guide portion 310 and the frame guide portion 320 may be integrally formed with each other.

The guide portion 300 may include a periphery guide portion 330 provided along a periphery of the frame 173 to guide coating of the first adhesive (110 in FIG. 7).

The periphery guide portion 330 may be provided near an inner edge side of the frame 173. The periphery guide portion 330 may be provided near a periphery of the opening 176. However, the position of the periphery guide portion 330 is not limited thereto.

The periphery guide portion 330 and the frame guide portion 320 may be connected to each other. The periphery guide portion 330, the frame guide portion 320, and the sidewall guide portion 310 may be integrally formed with each other.

As is apparent from the above, the display apparatus can reduce the manufacturing cost and improve the productive by coating a conductive adhesive to prevent ESD from occurring rather than attaching a conductive tape.

The display apparatus can effectively prevent static electricity from being discharged to the inside of the display apparatus by including carbon nanotubes (CNTs) in a conductive adhesive coated on a bezel.

Although exemplary embodiments of the disclosure have been described for illustrative purposes, those skilled in the art will appreciate that various modifications, additions and substitutions are possible, without departing from the scope and spirit of the disclosure. Therefore, exemplary embodiments of the disclosure have not been described for limiting purposes. Accordingly, the scope of the disclosure is not to be limited by the above embodiments but by the claims and the equivalents thereof.

What is claimed is:

1. A display apparatus, comprising:
a display panel on which an image is to be displayed;
a chassis arranged at a rear side of the display panel, the chassis including a conductive material;
an adhesive including a conductive material, the adhesive including a first adhesive, a second adhesive and a third adhesive,
a bezel configured to support the display panel and including a non-conductive material, the adhesive being applied as a form of a layer by being coated inside an inner side surface of the bezel such that static electricity is guided away from being discharged toward an inside of the display panel,
wherein the bezel includes a frame configured to support a front surface of the display panel and sidewalls protruding from the frame to cover lateral surfaces of the display panel; and
the inner side surface of the bezel further includes a guide portion which includes:
a first guide portion formed on a rear surface of the frame such that the first adhesive is coated in the first guide portion on the rear surface of the frame and faces the front surface of the display panel,
a second guide portion formed on the sidewalls of the frame such that the second adhesive is coated in the second guide portion on the sidewalls of the frame and faces the chassis, and
a third guide portion formed on the rear surface of the frame and connected to the second guide portion such that the second adhesive is continuously coated with the third adhesive.

2. The display apparatus of claim 1, wherein the adhesive includes carbon.

3. The display apparatus of claim 2, wherein the adhesive includes carbon nanotubes (CNTs).

4. The display apparatus of claim 3, wherein the adhesive includes 5 to 8 wt % of the CNTs.

5. The display apparatus of claim 1, wherein the adhesive includes a polyurethane (PU)-based resin to mitigate an impact applied to the display panel.

6. The display apparatus of claim 5, wherein the adhesive includes 70 to 75 w % of the polyurethane (PU)-based resin.

7. The display apparatus of claim 1, wherein the first adhesive is coated on a periphery of the frame that makes contact with the display panel to protect the display against electrostatic discharge (ESD).

8. The display apparatus of claim 7, wherein the first adhesive is continuously coated without being disconnected at a corner of the frame.

9. The display apparatus of claim 1, wherein the guide portion includes a guide groove configured to receive the adhesive.

10. The display apparatus of claim 1, wherein the first guide portion is provided on a periphery of the frame to guide coating of the first adhesive.

\* \* \* \* \*